United States Patent
Gur et al.

(10) Patent No.: US 10,794,955 B2
(45) Date of Patent: Oct. 6, 2020

(54) METHODS AND SYSTEMS FOR TESTING A TESTER

(71) Applicant: Optimal Plus Ltd., Holon (IL)

(72) Inventors: Hagay Gur, Hod HaSharon (IL); Dan Glotter, Tel-Aviv (IL); Shaul Teplinsky, San Francisco, CA (US)

(73) Assignee: OPTIMAL PLUS LTD, Holon (IL)

( * ) Notice: Subject to any disclaimer, the term of this patent is extended or adjusted under 35 U.S.C. 154(b) by 60 days.

(21) Appl. No.: 16/161,849

(22) Filed: Oct. 16, 2018

(65) Prior Publication Data
US 2020/0116789 A1    Apr. 16, 2020

(51) Int. Cl.
  *G01R 31/319*  (2006.01)
  *G01R 31/317*  (2006.01)
  *G01R 31/3193* (2006.01)

(52) U.S. Cl.
  CPC ... *G01R 31/31905* (2013.01); *G01R 31/3193* (2013.01); *G01R 31/31718* (2013.01); *G01R 31/31901* (2013.01); *G01R 31/31908* (2013.01)

(58) Field of Classification Search
  CPC ........ G01R 31/31905; G01R 31/31908; G01R 31/31718; G01R 31/31901; G01R 31/3193
  See application file for complete search history.

(56) References Cited

U.S. PATENT DOCUMENTS

| | | | |
|---|---|---|---|
| 6,480,978 B1* | 11/2002 | Roy ............... | G01R 31/31905 714/724 |
| 9,885,751 B2 | 2/2018 | Rousseau et al. | |
| 2002/0175697 A1* | 11/2002 | Miller ............. | G01R 31/31905 324/762.01 |
| 2018/0259579 A1* | 9/2018 | Sobolewski ..... | G01R 31/31924 |
| 2019/0354453 A1* | 11/2019 | Hsu .................... | G01R 31/2834 |

* cited by examiner

*Primary Examiner* — Thien Nguyen
(74) *Attorney, Agent, or Firm* — Browdy and Neimark, PLLC

(57) ABSTRACT

A method of testing a tester, comprising testing electronic units using a plurality of sites in order to obtain first bin assignment, instructing the tester to perform a tester quality test if conditions $C_{iQA,1}$ and $C_{iQA,2}$ are met, the tester quality test comprising performing a second plurality of tests on an electronic unit using a first site, thereby obtaining second bin assignment for the electronic unit, the second bin assignment being representative of passing or failing of the electronic unit of the second plurality of tests with respect to at least one second test criteria, wherein $C_{iQA,1}$ is met if passing first bin assignment has been obtained for said electronic unit connected to the tester using the first site, and wherein $C_{iQA,2}$ is met if data representative of passing first bin assignment obtained for electronic units which have been tested on the first site, meets a quality criteria.

26 Claims, 10 Drawing Sheets

| | First site | ... | K$^{th}$ site |
|---|---|---|---|
| DUT 1 | Bin X | | |
| DUT 2 | | | Bin Y |
| ... | ... | ... | ... |
| ... | ... | ... | ... |
| DUT N | | Unknown | |

| $N_{LOT}$ | $N_{QA}$ |
|---|---|
| $1 < N_{LOT} < N_1$ | ALL |
| $N_1 < N_{LOT} < N_2$ | $N'_1$ |
| $N_2 < N_{LOT} < N_3$ | $N'_2$ |
| $N_4 < N_{LOT} < N_5$ | $N'_3$ |
| $N_6 < N_{LOT} < N_7$ | $N'_4$ |
| $N_8 < N_{LOT} < N_9$ | $N'_5$ |

METHODS AND SYSTEMS FOR TESTING A TESTER

TECHNICAL FIELD

The presently disclosed subject matter relates to methods and systems for testing a tester.

BACKGROUND

Manufacturing of electronic units, such as electronic chips, generally involves a step of testing these electronic units. Various series of tests can be performed in order to check whether the electronic units are operational and not defective. These tests are generally performed using one or more testers. The tester itself needs also to be tested, in order to verify whether it is operational.

There is now a need to propose new methods and systems for testing the tester.

GENERAL DESCRIPTION

In accordance with certain aspects of the presently disclosed subject matter, there is provided a method of testing a tester configured to test electronic units, wherein electronic units are connected to the tester using a plurality of sites, said plurality of sites comprising at least one first site and at least one second site, the method comprising:
performing operation $O_i$ which comprises performing, by the tester, a first plurality of tests on at least two electronics units, thereby obtaining first bin assignment of each of said electronic units, said first bin assignment being representative of passing or failing of each of said electronic units of said first plurality of tests with respect to at least one first test criteria,
wherein, during said first plurality of tests, at least one of said electronic units is connected to the tester using said first site, and at least one of said electronic units is connected to the tester using said second site, wherein $O_i$ is performed for one or more values of i, and
when i reaches a predetermined value $i_{QA}$, performing operation $O_{i+1}$ which comprises instructing the tester to perform a tester quality test if conditions $C_{iQA,1}$ and $C_{iQA,2}$ are met, said tester quality test comprising performing a second plurality of tests on an electronic unit using said first site, wherein said electronic unit was already connected to the tester using said first site at previous operation $O_{i_{QA}}$, thereby obtaining second bin assignment for said electronic unit, said second bin assignment being representative of passing or failing of said electronic unit of said second plurality of tests with respect to at least one second test criteria,
wherein $C_{iQA,1}$ is met if passing first bin assignment has been obtained for said electronic unit connected to the tester using the first site at operation $O_{i_{QA}}$,
wherein $C_{iQA,2}$ is met if data representative of passing first bin assignment obtained for electronic units which have been tested on the first site meets a quality criteria,
wherein the second plurality of tests comprise at least a subset of the first plurality of tests, and
wherein said second bin assignment is representative of performance of the tester, for testing said tester.

In addition to the above features, the method according to this aspect of the presently disclosed subject matter can optionally comprise one or more of features (i) to (v) below, in any technically possible combination or permutation:

i. the second test criteria is relaxed with respect to the first test criteria;
ii. during the tester quality test, an electronic unit which remains connected to the tester using the second site from operation $O_{i_{QA}}$ is not tested by the tester;
iii. if condition $C_{iQA,1}$ is not met, the method comprises repeating $O_i$ and $O_{i+1}$ until both conditions $C_{iQA,1}$ and $C_{iQA,2}$ are met, wherein the tester quality test is performed at operation $O_{i+1}$ on a site among the plurality of sites for which both conditions $C_{iQA,1}$ and $C_{iQA,2}$ are met, wherein said site can be different for different operations $O_{i+1}$;
iv. $C_{iQA,1}$ is met if a first bin assignment of said electronic unit corresponds to a best bin assignment among all possible bin assignments;
v. $C_{iQA,\,2}$ is met if data representative of at least one of a fraction and a number of passing first bin assignments of electronic units tested using said first site is the highest among said plurality of sites;
vi. performance of the tester is determined based at least on data representative of failing second bin assignment;
vii. performance of the tester is determined based at least on data representative of bin switching between the first bin assignment and the second bin assignment;
viii. $C_{iQA,1}$ is met if, for said electronic unit connected to the tester at previous operation $O_{i_{QA}}$, passing first bin assignment has been obtained following a first iteration of said first plurality of tests by the tester on said electronic unit;
ix. the method comprises for N electronic units to be tested by the tester, obtaining a number $N_{QA}$ of electronic units to be used for testing the tester, wherein $N_{QA} < N$, and determining values of i and $i_{QA}$ such that N electronic units are tested by the tester, and $N_{QA}$ electronic units are tested during said tester quality test.

According to another aspect of the presently disclosed subject matter there is provided a method of testing a tester configured to test electronic units, wherein electronic units are connected to the tester using a plurality of sites, said plurality of sites comprising at least one first site and at least one second site, the method comprising, by a processing unit:
obtaining first bin assignment of each of a first plurality of electronic units, said first bin assignment being representative of passing or failing of said electronic unit of a first plurality of tests with respect to at least one first test criteria,
wherein, during said first plurality of tests, at least a first subset of said first plurality of electronic units is connected to the tester using said first site, and at least a second subset of said first plurality of electronic units is connected to the tester using said second site,
instructing the tester to perform a tester quality test on said first site if condition $C_{QA}$ is met, said tester quality test comprising performing a second plurality of tests on each of a second plurality of electronic units using said first site, thereby obtaining second bin assignment for each of said second plurality of electronic units, wherein said second bin assignment is representative of passing or failing of each of said electronic units of said second plurality of tests with respect to at least one second test criteria,
wherein $C_{QA}$ is met if data representative of passing first bin assignments obtained for electronic units which have been tested using the first site meets a quality criteria, wherein said second plurality of electronic units comprises at least some of the first plurality of electronic units for which passing first bin assignments have been obtained, wherein the second plurality of tests comprise at least a subset of the first plurality of tests, and wherein said second bin assignments are representative of performance of the tester, for testing said tester.

In addition to the above features, the method according to this aspect of the presently disclosed subject matter can optionally comprise one or more of features (x) to (xii) below, in any technically possible combination or permutation:

x. the method comprises selecting, for the second plurality of electronic units, only electronic units of the first plurality of electronic units which met the first plurality of tests according to said at least one first test criteria with better performance than other electronic units of the first plurality of electronic units;

xi. a maximal number $N_{QA}$ of electronic units in said second plurality of electronic units depends on a total number $N_{LOT}$ of said first plurality of electronic units, wherein a relationship between $N_{QA}$ and $N_{LOT}$ is predefined;

xii. said second plurality of electronic units comprises only electronic units for which passing first bin assignments have been obtained following a first iteration of said first plurality of tests by the tester on said electronic units According to another aspect of the presently disclosed subject matter there is provided a system for testing a tester configured to test electronic units, wherein electronic units are connected to the tester using a plurality of sites, said plurality of sites comprising at least one first site and at least one second site, the system being configured to:

obtain, at operation $O_i$, first bin assignment of each at least two electronic units, said first bin assignment being representative of passing or failing of each of said electronic units of a first plurality of tests with respect to at least one first test criteria, wherein, during said first plurality of tests, at least one of said electronic units is connected to the tester using said first site, and at least one of said electronic units is connected to the tester using said second site, wherein $O_i$ is performed for one or more values of i, and when i reaches a predetermined value $i_{QA}$, perform operation $O_{i+1}$ which comprises instructing the tester to perform a tester quality test if conditions $C_{iQA,1}$ and $C_{iQA,2}$ are met, said tester quality test comprising performing a second plurality of tests on an electronic unit using said first site, wherein said electronic unit was already connected to the tester using said first site at previous operation $O_{i_{QA}}$, thereby obtaining second bin assignment for said electronic unit, said second bin assignment being representative of passing or failing of said electronic unit of said second plurality of tests with respect to at least one second test criteria, wherein $C_{iQA,1}$ is met if passing first bin assignment has been obtained for said electronic unit connected to the tester using the first site at operation $O_{i_{QA}}$, wherein $C_{iQA,2}$ is met if data representative of passing first bin assignment obtained for electronic units which have been tested on the first site meets a quality criteria, wherein the second plurality of tests comprise at least a subset of the first plurality of tests, and wherein said second bin assignment is representative of performance of the tester, for testing said tester.

In addition to the above features, the system according to this aspect of the presently disclosed subject matter can optionally comprise one or more of features (xiii) to (xxi) below, in any technically possible combination or permutation:

xiii. the second test criteria is relaxed with respect to the first test criteria;

xiv. during the tester quality test, an electronic unit which remains connected to the tester using the second site from operation $O_{i_{QA}}$ is not tested by the tester;

xv. if condition $C_{iQA,1}$ is not met, the system is configured to repeat $O_i$ and $O_{i+1}$ until both conditions $C_{iQA,1}$ and $C_{iQA,2}$ are met, wherein the tester quality test is performed at operation $O_{i+1}$ on a site among the plurality of sites for which both conditions $C_{iQA,1}$ and $C_{iQA,2}$ are met, wherein said site can be different for different operations $O_{i+1}$;

xvi. $C_{iQA,1}$ is met if a first bin assignment of said electronic unit corresponds to a best bin assignment among all possible bin assignments;

xvii. $C_{iQA,2}$ is met if data representative of at least one of a fraction and a number of passing first bin assignments of electronic units tested using said first site is the highest among said plurality of sites;

xviii. performance of the tester is determined based at least on data representative of failing second bin assignment;

xix. performance of the tester is determined based at least on data representative of bin switching between the first bin assignment and the second bin assignment;

xx. $C_{iQA,1}$ is met if, for said electronic unit connected to the tester at previous operation $O_{i_{QA}}$, passing first bin assignment has been obtained following a first iteration of said first plurality of tests by the tester on said electronic unit; and xxi. the system is configured to: for N electronic units to be tested by the tester, obtain a number $N_{QA}$ of electronic units to be used for testing the tester, wherein $N_{QA}<N$, and determine values of i and $i_{QA}$ such that N electronic units are tested by the tester, and $N_{QA}$ electronic units are tested during said tester quality test.

According to another aspect of the presently disclosed subject matter there is provided a system of testing a tester configured to test electronic units, wherein electronic units are connected to the tester using a plurality of sites, said plurality of sites comprising at least one first site and at least one second site, the system being configured to:

obtain first bin assignment of each of a first plurality of electronic units, said first bin assignment being representative of passing or failing of said electronic units of a first plurality of tests with respect to at least one first test criteria, wherein, during said first plurality of tests, at least a first subset of said first plurality of electronic units is connected to the tester using said first site, and at least a second subset of said first plurality of electronic units is connected to the tester using said second site, instruct the tester to perform a tester quality test on said first site if condition $C_{QA}$ is met, said tester quality test comprising performing a second plurality of tests on each of a second plurality of electronic units using said first site, thereby obtaining second bin assignment for each of said second plurality of electronic units, wherein said second bin assignment is representative of passing or failing of each of said electronic units of said second plurality of tests with respect to at least one second test criteria, wherein $C_{QA}$ is met if data representative of passing first bin assignments obtained for electronic units which have been tested using the first site meets a quality criteria, wherein said second plurality of electronic units comprises at least some of the first plurality of electronic units for which passing first bin assignments have been obtained, wherein the second plurality of tests comprise at least a subset of the first plurality of tests, and wherein said second bin assignments are representative of performance of the tester, for testing said tester.

In addition to the above features, the system according to this aspect of the presently disclosed subject matter can optionally comprise one or more of features (xxii) to (xxiv) below, in any technically possible combination or permutation:

xxii. the system is configured to select, for the second plurality of electronic units, only electronic units of the first plurality of electronic units which met the first plurality of tests according to said at least one first test criteria with better performance than other electronic units of the first plurality of electronic units;

xxiii. a maximal number $N_{QA}$ of electronic units in said second plurality of electronic units depends on a total number $N_{lot}$ of said first plurality of electronic units, wherein a relationship between $N_{QA}$ and $N_{LOT}$ is predefined;

xxiv. said second plurality of electronic units comprises only electronic units for which passing first bin assignments have been obtained following a first iteration of said first plurality of tests by the tester on said electronic units.

In accordance with certain aspects of the presently disclosed subject matter, there is provided a non-transitory storage device readable by a machine, tangibly embodying a program of instructions executable by the machine to perform a method of testing a tester configured to test electronic units, wherein electronic units are connected to the tester using a plurality of sites, said plurality of sites comprising at least one first site and at least one second site, the method comprising:

performing operation $O_i$ which comprises performing, by the tester, a first plurality of tests on at least two electronic units, thereby obtaining first bin assignment of each of said electronic units, said first bin assignment being representative of passing or failing of each of said electronic units of said first plurality of tests with respect to at least one first test criteria, wherein, during said first plurality of tests, at least one of said electronic units is connected to the tester using said first site, and at least one of said electronic units is connected to the tester using said second site, wherein $O_i$ is performed for one or more values of i, and when i reaches a predetermined value $i_{QA}$, performing operation $O_{i+1}$ which comprises instructing the tester to perform a tester quality test if conditions $C_{iQA,1}$ and $C_{iQA,2}$ are met, said tester quality test comprising performing a second plurality of tests on an electronic unit using said first site, wherein said electronic unit was already connected to the tester using said first site at previous operation $O_{i_{QA}}$, thereby obtaining second bin assignment for said electronic unit, said second bin assignment being representative of passing or failing of said electronic unit of said second plurality of tests with respect to at least one second test criteria, wherein $C_{iQA,1}$ is met if passing first bin assignment has been obtained for said electronic unit connected to the tester using the first site at operation $O_{i_{QA}}$;

wherein $C_{iQA,2}$ is met if data representative of passing first bin assignments obtained for electronic units which have been tested on the first site meets a quality criteria, wherein the second plurality of tests comprise at least a subset of the first plurality of tests, and wherein said second bin assignment is representative of performance of the tester, for testing said tester.

In addition to the above features, the non-transitory storage device according to this aspect of the presently disclosed subject matter can optionally perform a method comprising one or more of features (i) to (ix) above, in any technically possible combination or permutation.

In accordance with certain aspects of the presently disclosed subject matter, there is provided a non-transitory storage device readable by a machine, tangibly embodying a program of instructions executable by the machine to perform a method of testing a tester configured to test electronic units, wherein electronic units are connected to the tester using a plurality of sites, said plurality of sites comprising at least one first site and at least one second site, the method comprising, by a processing unit:

obtaining first bin assignment of each of a first plurality of electronic units, said first bin assignment being representative of passing or failing of said electronic units of a first plurality of tests with respect to at least one first test criteria, wherein, during said first plurality of tests, at least a first subset of said first plurality of electronic units is connected to the tester using said first site, and at least a second subset of said first plurality of electronic units is connected to the tester using said second site, instructing the tester to perform a tester quality test on said first site if condition $C_{QA}$ is met, said tester quality test comprising performing a second plurality of tests on each of a second plurality of electronic units using said first site, thereby obtaining second bin assignment for each of said second plurality of electronic units, wherein said second bin assignment is representative of passing or failing of each of said electronic units of said second plurality of tests with respect to at least one second test criteria, wherein $C_{QA}$ is met if data representative of passing first bin assignments obtained for electronic units which have been tested using the first site meets a quality criteria, wherein said second plurality of electronic units comprises at least some of the first plurality of electronic units for which passing first bin assignments have been obtained, wherein the second plurality of tests comprise at least a subset of the first plurality of tests, and wherein said second bin assignments are representative of performance of the tester, for testing said tester.

In addition to the above features, the non-transitory storage device according to this aspect of the presently disclosed subject matter can optionally perform a method comprising one or more of features (x) to (xii) above, in any technically possible combination or permutation.

According to some embodiments, the proposed solution improves reliability, accuracy and quality of the test of the tester.

According to some embodiments, the proposed solution reduces the time needed for testing the tester.

According to some embodiments, the proposed solution allows integrating operations for testing the tester in the process of testing DUTs (Devices Under Test).

According to some embodiments, the proposed solution allows testing the tester and testing other DUTs at the same time.

According to some embodiments, the proposed solution allows testing the tester with DUT(s) which remain connected to the tester after a test, thereby simplifying and improving the process of testing the tester.

According to some embodiments, the proposed solution provides an automated method, or semi-automated method.

BRIEF DESCRIPTION OF THE DRAWINGS

In order to understand the invention and to see how it can be carried out in practice, embodiments will be described, by way of non-limiting examples, with reference to the accompanying drawings, in which.

DETAILED DESCRIPTION

In the following detailed description, numerous specific details are set forth in order to provide a thorough understanding of the invention. However, it will be understood by those skilled in the art that the presently disclosed subject matter may be practiced without these specific details. In other instances, well-known methods have not been described in detail so as not to obscure the presently disclosed subject matter.

Unless specifically stated otherwise, as apparent from the following discussions, it is appreciated that throughout the specification discussions utilizing terms such as "obtaining", "determining", "instructing", "associating", or the like, refer to the action(s) and/or process(es) of a processing unit that manipulates and/or transforms data into other data, said data represented as physical, such as electronic, quantities and/or said data representing the physical objects.

The term "processing unit" covers any computing unit or electronic unit with data processing circuitry that may perform tasks based on instructions stored in a memory, such as a computer, a server, a chip, a processor, a hardware processor, etc. It encompasses a single processor or multiple processors, which may be located in the same geographical zone or may, at least partially, be located in different zones and may be able to communicate together.

The term "memory" as used herein should be expansively construed to cover any volatile or non-volatile computer memory suitable to the presently disclosed subject matter.

Embodiments of the presently disclosed subject matter are not described with reference to any particular programming language. It will be appreciated that a variety of programming languages may be used to implement the teachings of the presently disclosed subject matter as described herein.

The invention contemplates a computer program being readable by a computer for executing one or more methods of the invention. The invention further contemplates a machine-readable memory tangibly embodying a program of instructions executable by the machine for executing one or more methods of the invention.

Figure 1:
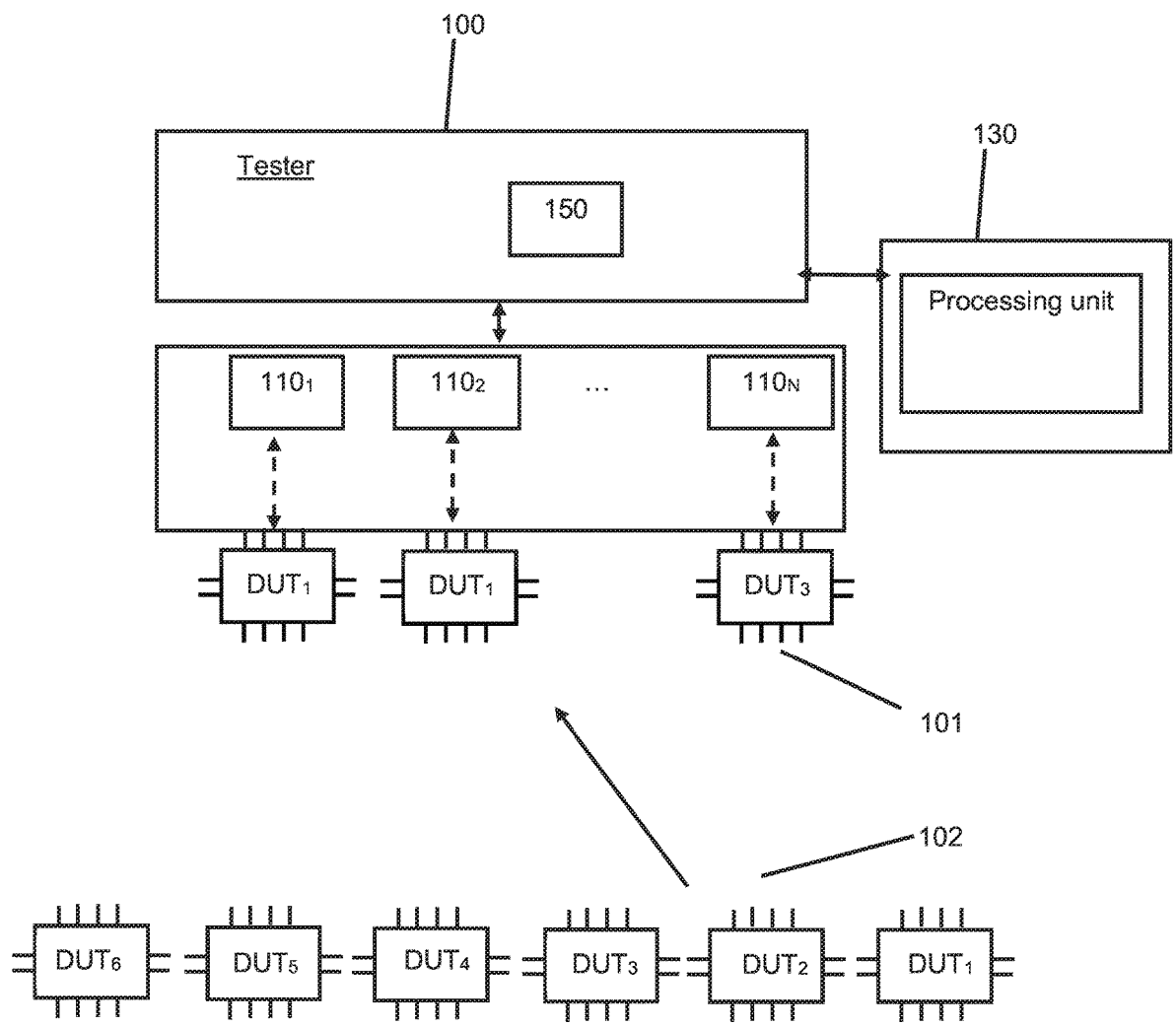
FIG. 1 illustrates an embodiment of a tester.

FIG. 1 illustrates an embodiment of a tester 100. This tester 100 is configured to perform tests of devices under test (DUTs) 101. These DUTs can include e.g. electronic units, e.g. chips, CPUs, arrays of memory, analog devices, mixed signal devices, and/or any other IC devices, boards (PCBs), multi-chip packages (MCPs), multi-chip modules (MCM), system-on-chip (SOCs), LEDs, LCDs, sensors, MEMS devices, etc.

These tests can be used to determine whether the DUTs are operational or faulty. These tests can be performed e.g. after the DUTs have been manufactured or during some intermediate steps of the manufacturing process.

In particular, various data of the DUTs can be collected during testing: temperature, pressure, absolute/relative position of electronic elements, absolute/relative size of electronic elements, response time, frequency, electrical resistance, manufacturing data, operating voltage, power consumption, leakage current, etc. This list is however not limitative.

The tests can thus comprise e.g. electronic tests, mechanical tests, stress tests, electromagnetic tests, etc. The order and/or the duration of the tests can be defined by an operator and/or stored in a memory, such as a memory of the tester 100.

The tester 100 can comprise various components, such as one or more processing units, a memory, electric circuitry, one or more power supplies, pick-and-place (P&P) handlers, etc. This is however not limitative.

The memory can store instructions readable by the processing unit to execute a sequence of one or more tests.

The tester 100 can comprise and/or communicate with various sensors 150, such as (but not limited to) temperature sensors, pressure sensors, motion sensors, frequency sensors, force sensors, electromagnetic sensors, etc.

As depicted in FIG. 1, a plurality of sites 110 (see references $110_1, \ldots, 110_N$) can be used to connect DUTs 101 to the tester 100 during the tests. Generally, each DUT is connected to one site among the plurality of sites 110.

Since a plurality of sites are present, a plurality of DUTs can be connected to the tester 100, thereby allowing e.g. simultaneous test of a plurality of electronic units.

In the example of FIG. 1, a lot 102 comprises six DUTs to be tested ($DUT_1$ to $DUT_6$), and three sites are available. Three DUTs are first tested ($DUT_1$ to $DUT_3$—one DUT per site), and then three other DUTS of the lot are tested ($DUT_4$ to $DUT_6$—one DUT per site).

The sites 110 generally comprise an interface allowing the connection of the tester 100 to the DUTs and allowing collection of test data from the DUT (such as an electronic interface), and in some embodiments, also maintain physically the DUTs in place during testing.

In some embodiments, the sites 110 can comprise a socket for physically holding the device in place during the testing, an electric circuitry for passing signals between the tester and the DUT (lines), and other elements allowing the tester to connect to the DUT and to collect test data from the DUT, etc.

For example, the sites 110 can be part of a Probe Card and/or a Load Board.

In some embodiments, the sites 110 can comprise a probe or head which connects to the DUTs (in this case the sites 110 are not necessarily used for holding the device in place during the testing) in order to ensure electrical connection between the DUTs and the tester 100. For example, a probe can be located at an extremity of a movable arm and connects to the upper part of the DUTs.

The response of the tests (test data) can be acquired by the various sensors 150 present in the tester 100, and/or present at each site 110, and then stored e.g. in a memory of the tester 100.

During testing, data about the DUT is acquired by the various sensors 150 present in the tester 100 and/or present at each site 110, and then sometimes stored e.g. in a memory of the tester 100.

Based on this data, a test program can output a passing decision (indicating that the current test has been passed by the DUT) or a failing decision (indicating that the current test has been failed by the DUT). As explained hereinafter, based on one or more test results, the tester can assign a bin to the DUT (bin assignment).

A sequence of tests (a first plurality of tests) for collecting the data about the DUT performed by the tester is typically governed by the test program provided to the tester.

As shown in FIG. 1, the tester 100 can in some embodiments communicate with a device 130 which can send commands to the tester 100 for performing a tester quality test. The device 130 can comprise a processing unit, a memory, and can exchange data with the tester 100 using any known wired/wireless communication link or network. In some embodiments, the tester 100 itself stores instructions in a memory which is readable by the processing unit of the tester 100 and which can instruct the tester 100 to perform various tests, such as a tester quality test, as described hereinafter.

Figure 2:
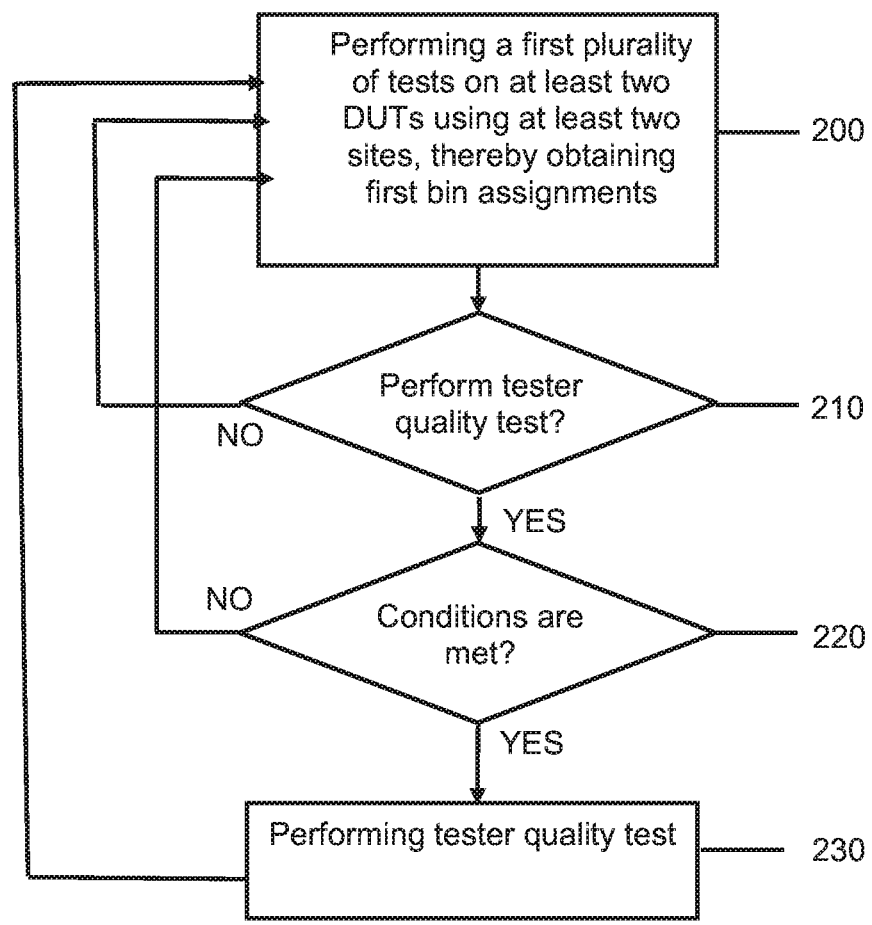
FIG. 2 illustrates an embodiment of a method of testing the tester.

Attention is now drawn to FIG. 2, which describes a possible embodiment of a method of testing the tester 100. This method can be performed at least partially by e.g. a processing unit of the tester 100 and/or of the device 130.

The method can comprise performing (see operation 200 in FIG. 2), by the tester 100, a first plurality of tests on at least two DUTs.

Assume at least two sites are present (or available) for connecting the DUTs to the tester, such as a first site and a second site. During the first plurality of tests of operation 200, one DUT is connected to the tester using the first site, and another DUT is connected to the tester using the second site.

Figure 2A:
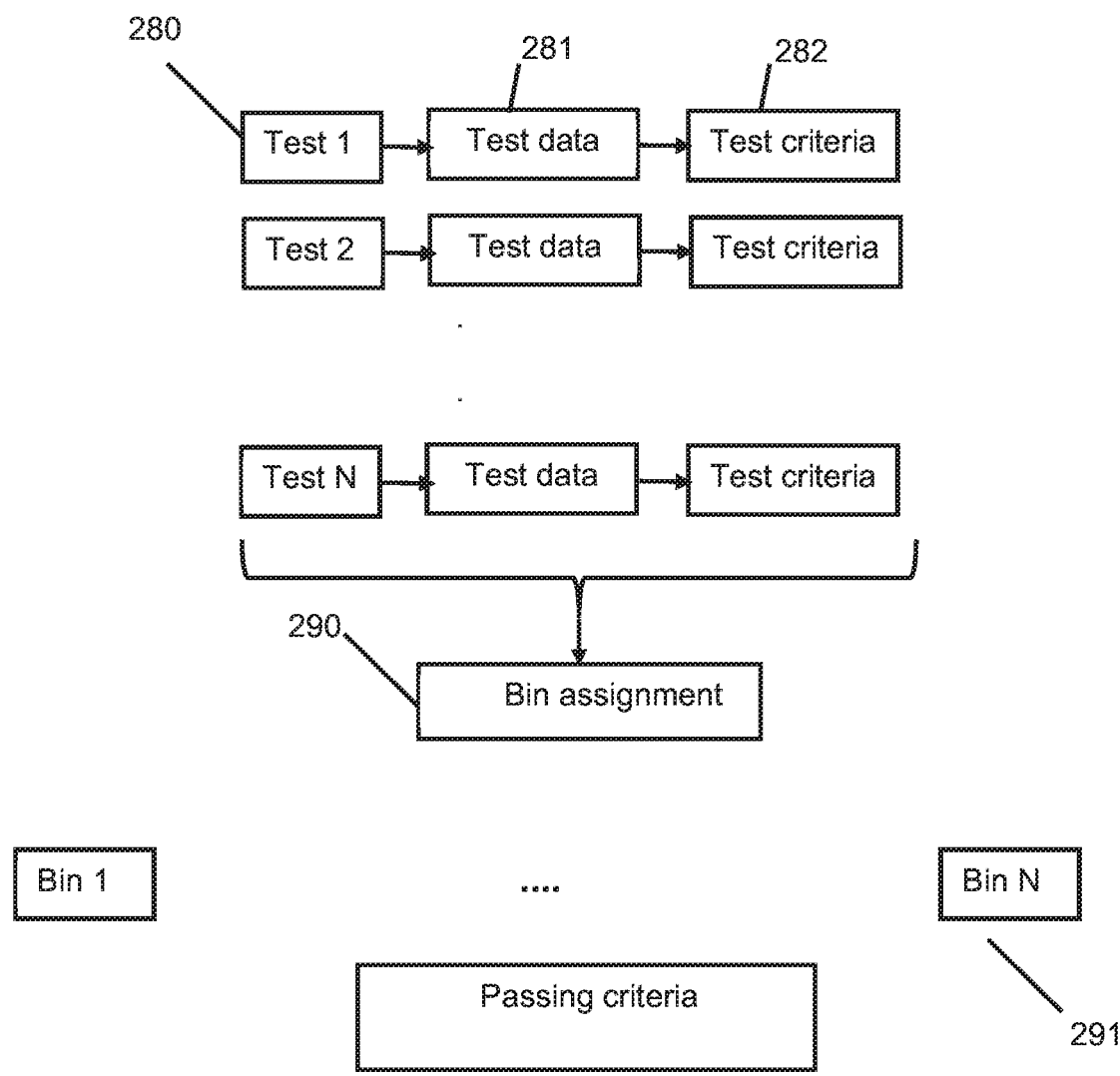
FIG. 2A illustrates a non-limitative example of a first plurality of test and corresponding first bin assignment.

As shown in FIG. 2A, the first plurality of tests can comprise a sequence of different tests 280 as governed by the test program of the tester. Examples of tests include e.g. temperature tests, electronic tests, time response tests, etc.

Generally, at each test, test data 281 are collected (which correspond e.g. to raw data measured on the DUT in response to the test). Depending on the type of test, different type of test data can be collected.

Test data can be analysed with respect to one or more first test criteria 282. Examples of test criteria include e.g. one or more thresholds. For each test of the first plurality of tests, the tester 100 (or another processing unit in communication with the tester 100) can compare the test data to the corresponding threshold and therefore can assess whether the DUT has passed or failed the test.

According to some embodiments, a different first test criteria can be associated to each test of the first plurality of tests.

Generally, after each test, the tester 100 (or a processing unit which controls the tester 100) can decide either to pursue with another test, or to stop testing the DUT. Depending on the test data/test results which are obtained, some DUTs can undergo more tests of the first plurality of tests than other DUTs.

Various sequences of tests can be stored in a memory of the tester 100.

The test program decides which test to run and the sequence of tests to apply.

After completion of the first plurality of tests for each DUT (or at least some of these first plurality of tests), a first bin assignment 290 can be obtained.

A bin assignment can be viewed e.g. as an aggregated data (e.g. aggregated score) which reflects to what extent a DUT passed or failed one or more tests of the first plurality of tests with respect to the least one first test criteria.

The test program defines the assignment of a given bin to a DUT based on its passing or failing of the plurality of tests.

In particular, in some embodiments, a passing bin assignment can be associated with a DUT although it failed some of the first plurality of tests, because for example it failed tests which are considered as less critical.

In some embodiments, two bins can be defined. e.g. pass or fail, and the test program can be programmed to assign one or the other.

In some embodiments, more than two bins are defined and the test program can be programmed to assign one of the defined bins to the DUT. In this embodiment there may be more than one passing bin and/or more than one failing bin. As a non-limiting example, the rules of the test program may be programmed to assign a first passing bin to a DUT that passed the full plurality of tests while assigning a second passing bin to a DUT that passed only the critical tests. In this case the first bin is a "better" bin than the second bin. Depending on the rules of the test program, a certain passing bin can be considered as the "best" passing bin as it is assigned to a DUT passing the most stringent plurality of tests of the first plurality of tests. As another non-limiting example, the rules of the test program may be programmed to assign a first failing bin to a DUT that failed a specific test or tests while assigning a second failing bin to a DUT that failed another test or tests.

Operation 200 can be repeated a plurality of times. This means that the first two DUTs that have been tested are replaced by two other DUTs which also undergo the first plurality of tests. Again, these at least two other DUTs are connected to the tester using at least two different sites (the first site and the second site).

As a consequence, first bin assignments are also obtained for these two other DUTs.

Operation 200 can be repeated until it is decided to attempt to perform a tester quality test (see reference 210 in FIG. 2).

In some embodiments, the number of repetitions of operation 200, which are performed before the tester quality test is performed, can be predefined. For example, it can be predefined that after N repetitions of operation 200, it is attempted to perform a tester quality test.

In order to perform a tester quality test, one or more conditions need to be met (operation 220).

After the last repetition of operation 200, a first DUT is connected to the tester 100 using the first site and a second DUT is connected to the tester 100 using the second site.

In order to perform the tester quality test, one site among the first site and the second site needs to be selected.

This site can be viewed e.g. as the "best" site for performing the tester quality test.

Indeed, technical defects (such as mechanical defects, electrical defects, optical defects, calibration errors, etc.) can constitute a source of defects or errors present at a site and which can corrupt the test data of the tester at this site.

In addition, connection defects (such as weak or intermittent mechanical, electrical, thermal, etc. connection between the DUT and the site, etc.) can corrupt the test data of the tester at this site.

When testing the tester, erroneous conclusions can be drawn concerning performance of the tester because of corrupted test data. In other words, in some cases, it can be concluded that the tester is faulty, but this is in fact wrong, since this is due to the presence of technical defects in the site itself (and not in the tester), and/or to a faulty connection between the DUT and the site, Therefore, it is attempted to select a site for which the tester could be tested while minimizing errors in the tester quality test due to the presence of corrupted test data.

This can comprise:
  selecting the "best" site for performing tester quality test, in order to minimize the corruption of test data due to technical defects present in the site itself; and
  selecting a passing DUT which is already connected to the best site for performing tester quality test, in order to avoid connection defects between the DUT and the site that can corrupt test data.

Various embodiments for selecting the best site will be described with reference e.g. to FIGS. 3 and 3A.

Assume that the first site has been determined as the "best" site.

Assume that following last iteration of operation 200, a given DUT is still connected to the tester using the first site. Tester quality test can be performed using this given DUT (and this first site) only if passing first bin assignment has been obtained for this given DUT (this can be one of the conditions mentioned in operation 220).

Reusing a passing DUT that is still connected to the tester ensures that there are no connection defects that may corrupt the test data.

In other words, this requires that the passing bin (in case of two bins only) or a passing bin (in case of more than one passing bin) has been assigned to the given DUT following the first plurality of tests that were performed on this given DUT (hereinafter "passing first bin assignment").

In some embodiments, tester quality test is performed using the given DUT only if the best passing bin is assigned to the given DUT following the first plurality of tests.

Device 130 which can perform the method depicted in FIG. 2 can obtain information (e.g. pre-stored information, and/or information provided by an operator, and/or by analysing data provided by the test program) indicating which bin(s) correspond to the passing bins or failing bins, in order to check whether a passing bin (or in some cases the best bin) has been assigned to the given DUT by the test program of the tester following the first plurality of tests.

If a passing first bin assignment has been obtained, the method can comprise performing a tester quality test (operation 230). A device (e.g. device 130) communicating with the tester 100 can instruct the tester 100 to perform the tester quality test.

According to some embodiments, the condition is met only if passing first bin assignment has been obtained following a first iteration (also known as first pass) of the first plurality of tests by the tester on this given DUT.

When a tester tests a DUT, and assigns a failing bin to the DUT, in some cases, it attempts to repeat the first plurality of tests in order to check whether the DUT is really faulty. In some cases, after repetition of the first plurality of tests, passing first bin assignment can be obtained. According to some embodiments, a tester quality test is not performed on a DUT for which passing first bin assignment was obtained only after a repetition of the first plurality of tests.

Once it has been established that the one or more conditions are met, a tester quality test can be performed. The tester quality test can comprise performing on this given DUT, connected to the tester using the best site (first site in this example), a second plurality of tests.

According to some embodiments, this given DUT remains connected to the tester using the best site from last repetition of operation 200 (in which a first plurality of tests have been performed on this given DUT).

Therefore, it is not necessary to connect again this given DUT to the tester or to move a DUT in order to perform the tester quality test, which is thus time and cost effective, and avoids corruption of test data due to connection defects.

Figure 2B:
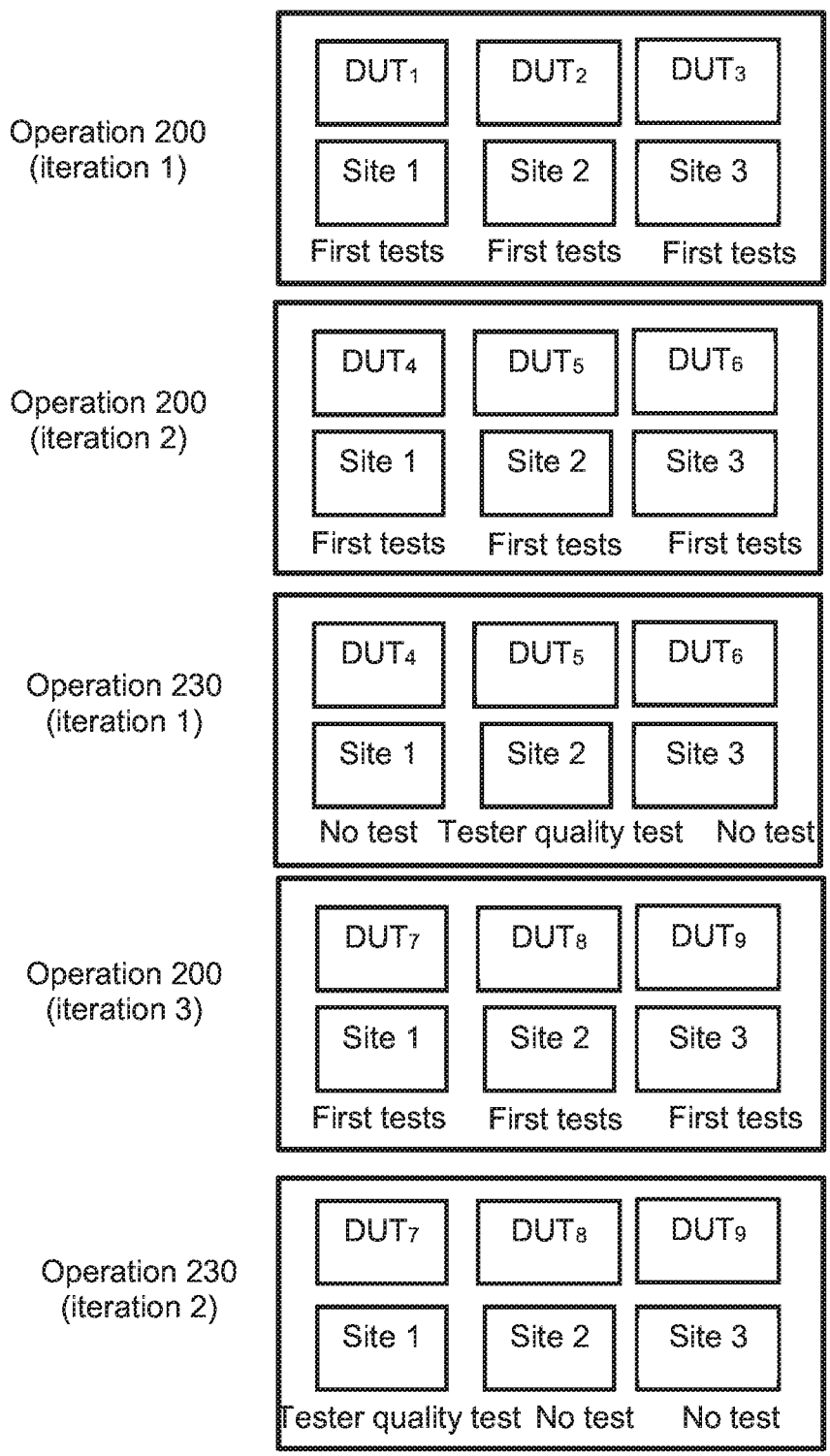
FIG. 2B illustrates a sequence of operations which can be performed to test DUTs and to test the tester.

A non-limitative example is illustrated in FIG. 2B (in this example, three sites are present), in which the second site is selected as the best site, and DUT 5 remains connected to the tester using the second site during the first plurality of tests (operation 200, iteration 2) and during the tester quality test (operation 230, iteration 1).

According to some embodiments, the other DUTs that were connected to the tester following the last iteration of operation 200 (using the sites which are not the best sites) can remain connected to the tester, but do not undergo a set of tests.

In other words, the given DUT is tested on the best site during the tester quality test while the other DUTs remain connected to the tester, but are not tested. A non-limitative example is illustrated in FIG. 2B, in which the second site is selected as the best site (see operation 230, iteration 1):
  DUT 5 remains connected to the tester using the second site during the first plurality of tests (operation 200, iteration 2) and during the tester quality test (see operation 230, iteration 1);
  DUT 4 (resp. DUT 6) remains connected to the tester using the first site (resp. third site) during the first plurality of tests (operation 200, iteration 2) and during the tester quality test (see operation 230, iteration 1), and does not undergo a test during the tester quality test.

According to some embodiments, the second plurality of tests can be identical to the first plurality of tests.

According to some embodiments, the second plurality of tests can comprise a subset of the first plurality of tests.

Similarly to the first plurality of tests (as explained with reference to FIG. 2A), test data are obtained. Test data are compared to at least one second test criteria, in order to determine whether the given DUT passed or failed the second plurality of tests. Based on these results, a second bin assignment is obtained for the given DUT. This process is similar to the first plurality of tests as described in FIG. 2A.

Similarly to the first bin assignment, the second bin assignment can be a passing bin assignment or a failing bin assignment (as decided by the test program).

According to some embodiments, the second test criteria is selected to be different from the first test criteria.

In particular, according to some embodiments, the second test criteria is relaxed with respect to the first test criteria (e.g. for each test, or for at least a subset of the tests).

In other words, for a test which is present both in the first plurality of tests and in the second plurality of tests, a DUT is supposed to pass, in an easier way, this test during the second plurality of tests, than during the first plurality of tests.

A simple example can be that if a DUT has to keep a pressure below a threshold $P_1$ during a stress test in order to pass a test of the first plurality of tests (operation 200), then in the second plurality of tests of the tester quality test (operation 230) the threshold $P_1$ can be increased to $P_2$, wherein $P_2 > P_1$ (the requirements of the test in the tester quality test are therefore relaxed).

The second bin assignment is representative of performance of the tester. Indeed, since the given DUT tested during the tester quality test was considered as a passing DUT following the first plurality of tests (since a passing bin was assigned to this given DUT following the first plurality of tests), and this DUT is tested during the tester quality test using the best site (thereby reducing possible measurement errors due to the site itself), and the DUT remains connected to the best site (thereby avoiding corruption of test data due to connection defects), if the tester is operational, the tester should output that a assign a passing bin to this DUT (passing second bin assignment).

If the tester provides that a failing bin is assigned to this DUT following the second plurality of tests (failing second bin assignment), this can be a clear indication that the tester is inconsistent, and therefore is faulty.

This is even more relevant when the second test criteria is relaxed. In this case, if the tester provides failing second bin assignment for the given DUT using the best site, this can be a clear indication that the tester is faulty.

Various methods can be implemented to assess performance of the tester based on the second bin assignment obtained following the tester quality test.

According to some embodiments, data representative of failing second bin assignment of this DUT can be indicative of the fact that the tester is faulty. For example, if failing second bin assignment is obtained for this given DUT, it can be concluded that the tester is faulty. To the contrary, if the second bin assignment corresponds to a passing second bin assignment, then the tester can be considered as operational.

According to some embodiments, if a bin switching is present between the first bin assignment and the second bin assignment of this given DUT, this can indicate that the tester is faulty.

For example, assume the first bin assignment is "bin 1" (best bin assignment) and that the second bin assignment is "bin 3" (bin assignment for a passing DUT with average performance), then the tester may still be considered faulty even though both bin assignments are passing.

Assume the first bin assignment is "bin 1" (best bin assignment) and that the second bin assignment is "bin 7" (bin assignment for a failing DUT), then the tester may be considered as clearly faulty.

In other words, bin switching can be used to assess the level of performance/failure of the tester (different levels of failure can be defined).

These examples are not limitative and various other rules can be used to assess performance of the tester based on data representative of bin switching.

As explained hereinafter, a tester quality test can be performed several times with different DUTs (see e.g. FIG. 2B). According to some embodiments, performance of the tester is assessed separately after each tester quality test. According to other embodiments, performance of the tester is assessed based on the results of a plurality of tester quality tests. These results are aggregated to provide an aggregated assessment of the performance of the tester.

According to some embodiments, the method can comprise providing an indication of the performance of the tester, based on results obtained during the tester quality test. The indication can comprise e.g. providing to an operator an output on a display (visual display, and/or audio display, etc.). According to some embodiments, this indication comprises a probability that the tester is faulty or operational.

As shown in FIG. 2 and FIG. 2B, various operations of the method can be repeated over time.

Operation 200 can be repeated (each time with different DUTs) until it is decided that a tester quality test needs to be performed.

For example, in FIG. 2B, operation 200 is first repeated twice, and then a tester quality test is performed (operation 230, iteration 1).

According to some embodiments, the number of times operation 200 is repeated before it is attempted to perform a tester quality test, can be predefined. A table can be stored which comprises the number of times operation 200 needs to be repeated before a tester quality test is performed. Therefore, in FIG. 2A, every time operation 200 has been repeated in accordance with this predefined number, this indicates that operation 210 and operation 220 can be performed in order to check whether a tester quality test can be performed.

According to some embodiments, this number can vary over time and is not necessarily fixed. For example, in FIG. 2B, operation 200 is repeated twice (operation 200, iterations 1 and 2) before a tester quality test is performed (operation 230, iteration 1), and then operation 200 is performed once (operation 200, iteration 3) before a tester quality test is performed (operation 230, iteration 2).

If this number is fixed, then table 200 can store e.g. a single value X, which indicates that after X repetitions of operation 200, it is attempted to perform a tester quality test.

If this number is variable, then table 200 can store various values which indicate e.g. after which repetition of operation 200 a tester quality test needs to be performed.

According to some embodiments, assume a lot of N DUTs need to be tested by the tester.

According to some embodiments, a number $N_{QA}$ ($N_{QA} < N$) of DUTs can be defined as the number of different DUTs which need to be tested during different tester quality tests. A table can be stored which defines a relationship between the total number N of DUTs to be tested by the tester and the number $N_{QA}$ of DUTs that need to be tested during the different tester quality tests.

Based on N and $N_{QA}$, it can be defined how many times operation 200 needs to be repeated before a tester quality test is performed. This depends also on the number of DUTs that can be tested at each operation 200 (which depends on the number of different available sites).

As shown in FIG. 2, after the required number of repetitions of operation 200 has been reached, it is attempted to perform a tester quality test (operations 210/220). In some cases, it may occur that the conditions required for performing the tester quality test are not met. For example, if a failing first bin assignment is obtained for the DUT tested using the best site at the last repetition of operation 200, then the tester quality test cannot be performed.

In this case, different measures can be taken.

According to some embodiments, since the tester quality test is not performed, operation 200 is repeated until the number of iterations reaches again the predefined number (which defines the number of repetitions required for operation 200), and then it is attempted to perform again a tester quality test.

According to other embodiments, since the tester quality test is not performed, operation 200 is repeated again (each time with new DUTs) until the conditions required for performing the tester quality test are met. In other words, as soon as the conditions are met, the tester quality test is performed.

As shown in FIG. 2B, tester quality test can be performed several times, and in some cases, the best site changes from one iteration to another.

In the example of FIG. 2B, the first iteration of tester quality test is performed using site 2 (considered as the best site) and the second iteration of tester quality test is performed using site 1 (considered as the best site). This example is however not limitative.

This change can be due to the fact that new data are used for assessing which site is the best site (in particular, data collected during the repetition of operation 200 can be collected).

Figures 3, 3A:
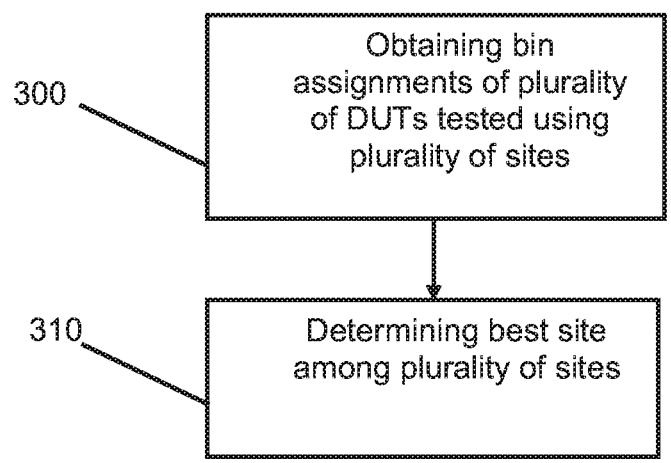
FIG. 3 illustrates an embodiment of a method of selecting a best site.
FIG. 3A illustrates an embodiment of data that can be used to select the best site.

Attention is now drawn to FIG. 3, which describes a method of determining the best site (or in some cases, a plurality of best sites).

This method can be performed at least partially by e.g. a processing unit of the tester 100 and/or of the device 130.

As explained with reference to FIG. 2, the tester quality test is generally performed on the DUT connected to the tester using the best site.

The method can comprise obtaining (operation 300) first bin assignments of a plurality of DUTs tested using a plurality of sites.

For example, this data can be obtained following previous iterations of operation 200, in which the first plurality of tests is performed on various DUTs before a tester quality test is performed.

This data can be collected from the beginning of the process described in FIG. 2, or from a predefined number of past iterations of operation 200.

Assume a lot of DUTs are currently being tested by the tester. According to some embodiments, this data can be collected also from test(s) performed by the tester on previous lots, and not necessarily from the test of the current lot.

This data can comprise, for each DUT which was tested according to the first plurality of tests by the tester:
First bin assignment obtained for this DUT;
Site used for testing this DUT.

A non-limitative example is illustrated in FIG. 3A, in which for each of a plurality of DUTs, first bin assignment 350 and the site 360 used for testing this DUT, are stored (e.g. in a memory of the tester). In some cases, if the first bin assignment is not available, corresponding data is stored to indicate this status.

Based on this data, the method can comprise determining the best site(s) (operation 310).

According to some embodiments, a given site can be selected as the best site if data representative of passing first bin assignments of DUTs tested using this given site meets a quality criteria.

In some embodiments, a ratio R1 is computed for each site, which corresponds to the ratio between the number of passing first bin assignments and the total number of bin assignments for this site. The quality criteria can be defined as the given site for which this ratio is the highest and/or meets a threshold.

In some embodiments, a ratio R2 is computed for each site, which corresponds to the ratio between the number of passing first bin assignments and the number of failing first bin assignments for this site. The quality criteria can be defined as the given site for which this ratio is the highest and/or meets a threshold.

According to some embodiments, a ratio R3 between a number of DUTs tested at this site and to which passing first bin has been assigned, and a total number of DUTs tested at this site excluding DUTs for which bin assignment could not be obtained (as explained with reference to FIG. 3A), can be computed. The quality criteria can be defined as the given site for which this number is the highest and/or meets a threshold.

In some embodiments, for each site, an absolute number of DUTs tested at this site and which are assigned with passing first bin is obtained. The quality criteria can be defined as the given site for which this number is the highest and/or meets a threshold.

Various ratios can be computed, as explained above (this list is not limitative). If a ratio is defined as x/y, which has to meet a threshold $T_{bsite}$, it is understood that the ratio can also be defined as y/x, with a threshold $1/T_{bsite}$.

According to some embodiments, the nature of the passing first bin assignments can be taken into account.

Indeed, as mentioned above, different levels of passing first bin assignments can exist: some bin assignments can correspond to the DUTs which passed the first plurality of tests with high performance, some bin assignments can correspond to the DUTs which passed the first plurality of tests with average performance, and some bin assignments can correspond to the DUTs which passed the first plurality of tests with lower performance.

This information can be taken into account to select the best site. For example, two sites can be associated with similar ratio/number of passing first bin assignments, but one of the sites can be associated with a higher number/ratio of passing first bin assignments corresponding to DUTs with high performance, and therefore should be selected as the best site.

Various possible definitions have been given for determining the best site. In some embodiments, a combination of one or more of these definitions, according to some weighting functions and/or statistical combination and/or aggregation and/or machine learning algorithms, etc. can be performed in order to select the best site(s).

Assume a simple example in which 100 DUTs have been tested by the tester 100. Assume 33 DUTs have been tested at a first site (a passing bin was assigned to 20 DUTs and a failing bin was assigned to 13 DUTs, following the first plurality of tests), 33 DUTs have been tested at a second site (a passing bin was assigned to 22 DUTs and a failing bin was assigned to 11 DUTs, following the first plurality of tests), and 34 DUTs have been tested at a third site (a passing bin was assigned to 30 DUTs, a failing bin was assigned to 2 DUTs and 2 DUTs could not be tested, following the first plurality of tests).

In this example:
R1 is equal to 0.606 for the first site, 0.66 for the second site, and 0.882 for the third site. If the quality criteria corresponds to the highest value R1, the third site is selected as the best site;
R2 is equal to 1.538 for the first site, 2 for the second site, and 15 for the third site. If quality criteria corresponds to the highest value R2, the third site is selected as the best site; and
R3 is equal to 0.606 for the first site, 0.66 for the second site, and 0.937 for the third site (30/32). If quality criteria corresponds to the highest value R3, the third site is selected as the best site.

As already depicted in FIG. 2, operation 200 can be repeated several times. In some embodiments, data used for determining the best site can be updated based on the repetition of operation 200, and therefore, the best site can change during time.

In some embodiments, it can be decided that the best site is determined once, and is not updated during time (although operation 200 is repeated and potential new data can be collected).

In other embodiments, it can be decided that the best site is changed dynamically based on the new data collected during the repetition of operation 200.

Figures 4, 4A:
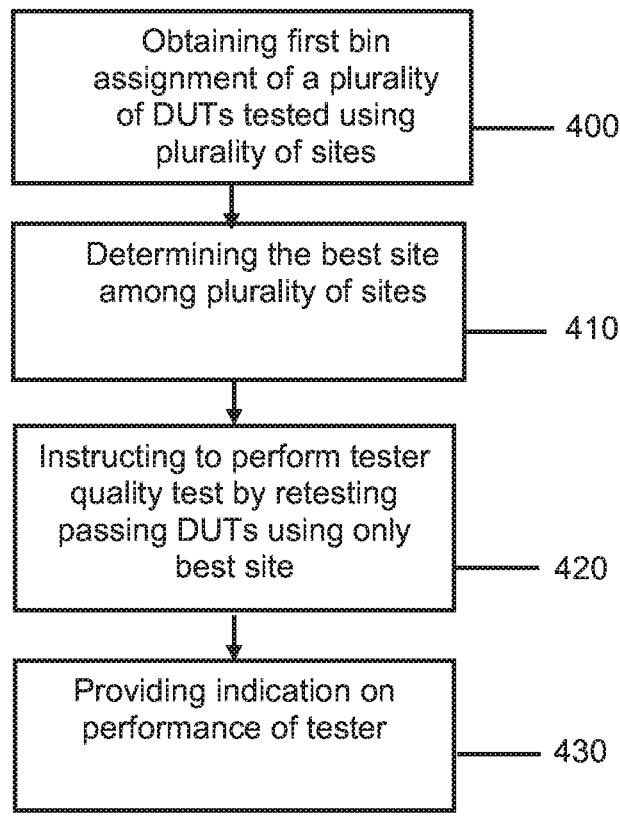
FIG. 4 illustrates another embodiment of a method of testing the tester.
FIG. 4A illustrates a table which defines a maximal number of DUTs to be used to testing the tester with respect to the size of the lot of DUTs to be tested by the tester.

Attention is now drawn to FIG. 4 which describes another embodiment of testing a tester. This method can be performed at least partially by e.g. a processing unit of the tester 100 and/or of the device 130.

The method can comprise (operation 400) obtaining a first bin assignment of each of a first plurality of DUTs. For example, the first plurality of DUTs can comprise a lot of N DUTs to be tested by the tester.

A first bin assignment can be obtained for each DUT by testing the DUT according to a first plurality of tests, as already explained in the previous embodiments. In particular, at least two different sites (or more) are used to connect the first plurality of DUTs to the tester during the first plurality of tests. The DUTs are placed on the different sites, removed and replaced by new DUTs, until the whole lot of N DUTs, or at least a subset of this lot, is tested by the tester.

The method can comprise obtaining for each DUT, its first bin assignment, and the site which was used to perform the first plurality of tests, as already shown in the non-limitative example of FIG. 3A.

Based on the obtained data, the method can comprise (operation 410) determining the "best" site among the plurality of sites. In some embodiments, more than one best site can be identified.

According to some embodiments, the best site can be the site for which data representative of passing first bin assignments obtained for DUTs which have been tested using this site, meets a quality criteria.

Embodiments for selecting the best site have already been described with reference to operation 310, and these embodiments can be used similarly in operation 410.

Once the best site has been determined (or in some embodiments, the plurality of best sites), the method can comprise (operation 420) instructing the tester 100 to perform a tester quality test. This operation can comprise sending commands to the tester 100 so as to make it perform a tester quality test as explained below.

The tester quality test aims in particular at testing the performance of the tester 100 itself.

In particular, operation 420 can comprise performing a second plurality of tests on a second plurality of DUTs using only the best site(s) (as determined in operation 410).

The second plurality of DUTs can comprise at least some of the DUTs of the first plurality of DUTs for which passing first bin assignment has been obtained. In other words, the second plurality of DUTs comprise either all, or at least some of the DUTs which were considered as passing DUTs following the first plurality of tests.

According to some embodiments, a maximal number $N_{QA}$ of DUTs in this second plurality of DUTs depends on a total number $N_{LOT}$ of the first plurality of DUTs, wherein a relationship between $N_{QA}$ and $N_{WT}$ is predefined.

A non-limitative example is shown in FIG. 4A, in which a table stores a relationship between $N_{QA}$ and $N_{LOT}$. For example, assume that $N_{LOT}$ is 200, and that a passing bin was assigned to 150 DUTs following the first plurality of tests. If for $N_{LOT}$=200, the table stores that $N_{QA}$ is 120, then not all the passing DUTs will be used for the tester quality test, but only 120 DUTs will be used.

According to some embodiments, the second plurality of DUTs comprise only DUTs for which passing first bin assignment has been obtained following a first iteration of the first plurality of tests by the tester on this DUT (first pass). Indeed, when a tester tests a DUT, and assigns a failing bin, in some cases, it attempts to repeat the first plurality of tests in order to check whether the DUT is really faulty. In some cases, after repetition of the first plurality of tests, passing first bin assignment can be obtained. According to some embodiments, the second plurality of DUTs does not comprise DUTs for which passing first bin assignment was obtained only after a repetition of the first plurality of tests.

According to some embodiments, the second plurality of tests can be identical to the first plurality of tests.

According to some embodiments, the second plurality of tests can comprise a subset of the first plurality of tests.

Similarly to the first plurality of tests, test data are obtained. Test data are compared to at least one second test criteria, in order to determine whether each DUT passed or failed the tests of the second plurality of tests. Based on these results, a second bin assignment is obtained for each DUT of the second plurality of DUTs.

According to some embodiments, the second test criteria is selected to be different from the first test criteria.

In particular, according to some embodiments, the second test criteria is relaxed with respect to the first test criteria. In other words, for a test which is identical in the first plurality of tests and in the second plurality of tests, it is easier to pass this test during the second plurality of tests than during the first plurality of tests.

The second bin assignment obtained for each DUT of the second plurality of DUTs is representative of performance of the tester. Indeed, since each DUT was considered as a passing DUT following the first plurality of tests (since a passing bin was assigned to this DUT following the first plurality of tests), and this DUT is tested during the tester quality test using the best site, if the tester is operational, the tester should output a passing bin for this DUT following the second plurality of tests (passing second bin assignment).

If the tester assigns a failing bin to this DUT following the second plurality of tests (failing second bin assignment), this can be a clear indication that the tester is inconsistent and therefore is faulty.

This is even more relevant when the second test criteria is relaxed. In this case, if the tester provides failing second bin assignment for the DUT, this can be a clear indication that the tester is faulty.

Various methods can be implemented to assess performance of the tester based on the second bin assignment. Examples of these methods have been described with reference to FIG. 2.

According to some embodiments, the method can comprise providing an indication of the performance of the tester (operation 430), based on the results obtained during the tester quality test. The indication can comprise e.g. providing to an operator an output on a display (visual display, and/or audio display, etc.). According to some embodiments, this indication comprises a probability that the tester is faulty or operational.

Figure 4B:
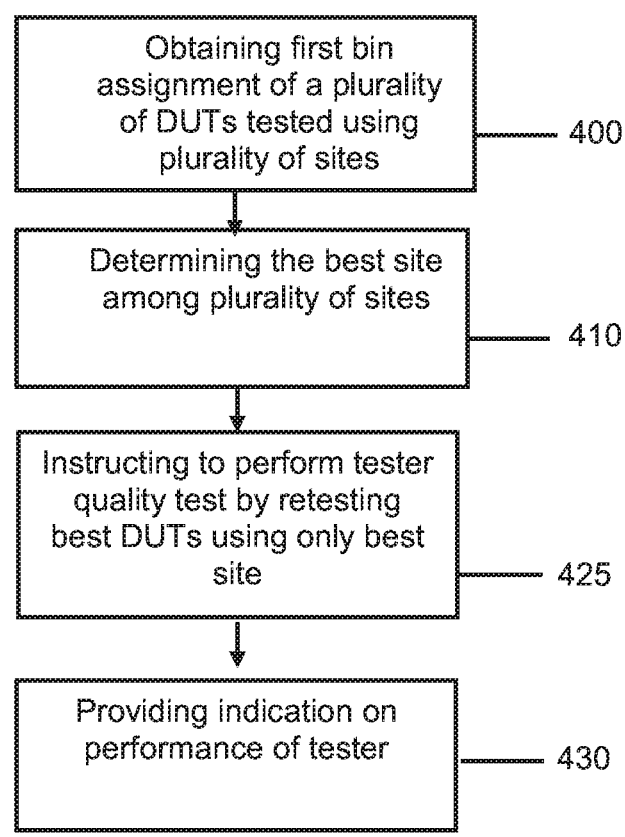
FIG. 4B illustrates another embodiment of a method of testing the tester.

Attention is drawn to FIG. 4B which describes a variant of the method of FIG. 4.

Operations 410 and 420 are similar in FIG. 4B to that described in FIG. 4.

In operation 425, the second plurality of DUTs is selected as a subset $G_{best}$ of the first plurality of DUTs, for which the following conditions are met:
 A passing bin was assigned to DUTs belonging to $G_{best}$ following the first plurality of tests; and
 DUTs belonging to $G_{best}$ passed the first plurality of tests with better performance than other DUTs of the first plurality of DUTs.

In other words, a selection of the "best" DUTs, among the passing DUTs, is performed in order to perform the tester quality test.

This embodiment does not rely only on binary data representing the fact that the DUTs passed or failed the first plurality of tests (passing or failing bin assignment), but also on qualitative data representing how (with which level of performance) the DUTs passed the first plurality of tests.

For example, assume a test of the first plurality of tests comprises testing the mechanical resistance of the DUT, which has to be above a threshold X for passing the test.

A first group of the DUT will pass the test, but only with "marginal" performance, a second group of the DUTs will pass the test with standard performance, and a third group of the DUTs will pass the test with high performance. For example, if W is the measured mechanical resistance of the first group, Y is the measured mechanical resistance of the second group and Z is the measured mechanical resistance of the third group, then $|W-X|<|Y-X|<|Z-X|$.

This representation in three levels of performance is schematic and is not limitative.

Embodiments for selecting $G_{best}$ will now be described. These embodiments are illustrative and various other embodiments can be used.

According to some embodiments, as already explained above (see e.g. FIG. 2A), a plurality of bins can be used to classify the DUTs following the first plurality of tests. In particular, if at least two bins are used for classifying the passing DUTs (hereinafter "passing bins"), these passing bins can reflect the level of performance of the DUTs in passing the first plurality of tests. For example, assume five bins are used, among which three bins correspond to passing bins.

Bin 1 can be assigned to the DUTs which passed the best first plurality of tests, bin 2 can be assigned to the DUTs which passed the first plurality of tests with average performance, and bin 3 can be assigned to the DUTs which passed the first plurality of tests with the lowest performance.

In this case, $G_{best}$ can be selected e.g. as DUTs which were assigned with bin 1. This is however not limitative.

According to some embodiments, $G_{best}$ can be determined by performing an analysis of the test data collected by the tester during the first plurality of tests.

According to some embodiments, assume the test data of the DUTs follow a curve, such as (but not limited to) a normal distribution. Assume the higher the absolute value of the test data, the better the performance of the corresponding DUT. Therefore, DUTs whose test data are located at the top of the curve can be selected as belonging to $G_{best}$.

According to some embodiments, assume the test data of the DUTs should be above a threshold for passing the test. DUTs whose test data are the highest with respect to the threshold can be selected as belonging to $G_{best}$.

According to some embodiments, assume the test data of the DUTs should be below a threshold for passing the test. DUTs whose test data are the lowest with respect to the threshold will be selected as belonging to $G_{best}$.

According to some embodiments, assume physical data of the DUTs should follow a given relationship during the test. DUTs whose test data (raw test data, corresponding to these physical data) follow the best given relationship will be selected as belonging to $G_{best}$. For example, the given relationship can be a relationship between pressure and temperature.

According to some embodiments, assume a lot of N DUTs has to be tested. A lot is generally defined as a group of DUTs which have some common points in their manufacturing conditions and/or manufacturing data (such as the time at which they were manufactured, the devices that were used for manufacturing these DUTs, the physical location of the DUTs, the wafer/structure on which the DUTs are manufactured, etc.).

Assume a number $N_1$ of the DUTs of the lot have been identified as "failing" DUTs following the first plurality of tests (a failing bin was assigned to these DUTs following the first plurality of tests), and a number $N_2$ of DUTs of the lot have been identified as "passing" DUTs following the first plurality of tests (a passing bin was assigned to these DUTs following the first plurality of tests). According to some embodiments, DUTs are assigned to the group $G_{best}$ only if they are associated with passing first bin assignment and if the number of DUTs of their lot meet a quality criteria.

In other words, the method can take into account not only the performance of each DUT itself, but also the performance of other DUTs which have similar characteristics and/or manufacturing data, and/or which belong to a similar lot.

Similarity in the manufacturing data/characteristics can be defined according to some similarity criteria (e.g. the DUTs were manufactured in a given period, and/or using given devices, and/or using given manufacturing conditions, such as temperature, etc.).

The quality criteria can be for example that $N_2$ is above a threshold. Indeed, assume a lot of 100 DUTs has been tested according to the first plurality of tests. A failing bin has been assigned to 95 DUTs following the first plurality of tests and a passing bin has been assigned to 5 DUTs following the first plurality of tests. Since the number of passing DUTs is low in this lot, this can indicate that although some of the DUTs were considered as passing DUTs in this lot, the whole lot should not be used for testing the performance of the tester, since this lot is most likely totally defective.

The method can comprise, at operation 425, instructing the tester to perform a tester quality test. This tester quality test can comprise performing a second plurality of tests on only the DUTs of $G_{best}$ (or a subset of $G_{best}$), using only the best site.

As already mentioned above for operation 230, the second plurality of tests can be identical to the first plurality of tests, or can comprise a subset of the first plurality of tests.

Similarly to the first plurality of tests, test data are obtained. Test data are compared to at least one second test criteria, in order to determine whether each DUT of $G_{best}$ passed or failed the second plurality of tests.

According to some embodiments, the second test criteria is selected to be different from the first test criteria.

In particular, according to some embodiments, the second test criteria is relaxed with respect to the first test criteria. In other words, for a test which is identical in the first plurality of tests and in the second plurality of tests, it is easier to pass this test during the second plurality of tests than during the first plurality of tests.

Based on these results, a second bin assignment is obtained for each DUT of $G_{best}$. As already mentioned for operation 230, the second bin assignments are representative of performance of the tester.

Indeed, since each DUT of $G_{best}$ was considered as a passing DUT following the first plurality of tests (since it was associated with a passing first bin assignment), and this DUT is tested during the tester quality test using the best site, if the tester is operational, the tester should assign a passing bin to this DUT following the second plurality of tests. This is true a fortiori in this embodiment in which the DUTs of $G_{best}$ are DUTs which passed the first plurality of tests with good or high performance.

Performance of the tester can be assessed similarly to what was described with respect to operation 230. As mentioned above, data representative of the number of failing second bin assignments, data representative of bin switching between first bin assignment and second bin assignment, etc. can be used to assess performance of the tester.

According to some embodiments, the method can comprise providing an indication of the performance of the tester, based on the results obtained during the tester quality test. The indication can comprise e.g. providing to an operator an output on a display (visual display, and/or audio display, etc.). According to some embodiments, this indication comprises a probability that the tester is faulty or operational.

Figure 5:
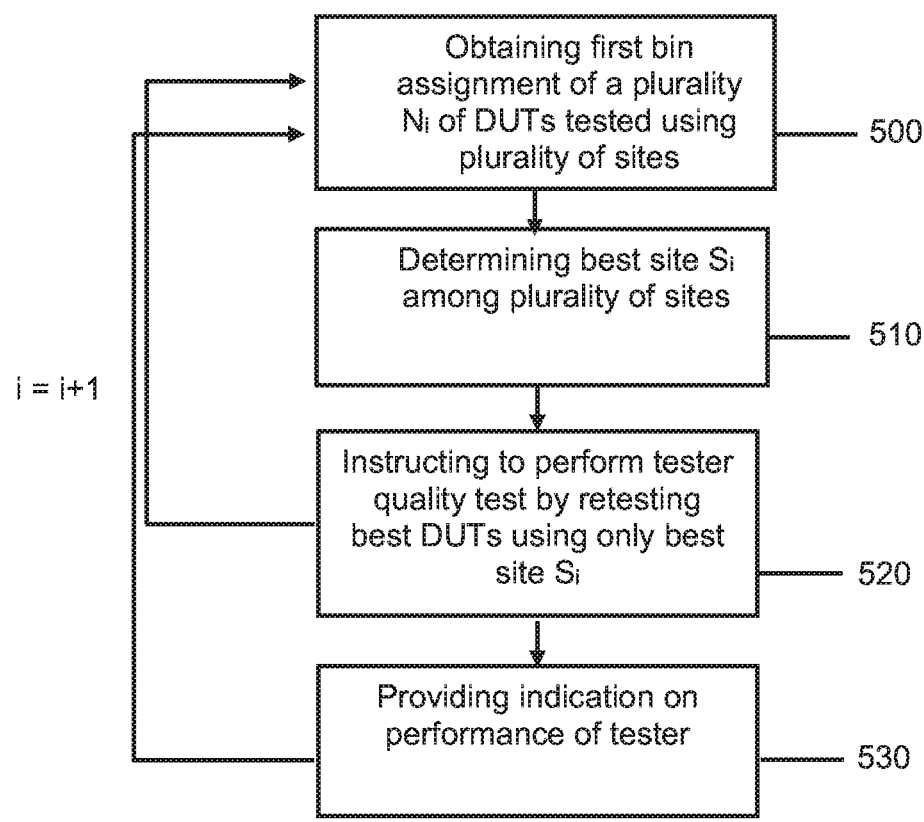
FIG. 5 illustrates the method of FIG. 4B in which operations are repeated.

Attention is now drawn to FIG. 5. This method can be performed at least partially by e.g. a processing unit of the tester 100 and/or of the device 130.

In some embodiments, at least some of the different operations described in FIG. 4B can be repeated over time.

Operation 500 is similar to operation 400. A plurality of $N_i$ DUTs are tested using the tester 100 according to a first plurality of tests. The DUTs are distributed over the various sites of the tester 100 during the test.

At operation 510, the best site $S_i$ is determined similarly to that described in operation 410. In some embodiments, a plurality of given sites $S_i$ are determined.

At operation 520, a tester quality test is performed, similarly to that described in operation 220. Second bin assignments are obtained for the tested DUTs. Only DUTs associated with passing first bin assignment and which passed the first plurality of tests with better performance than other DUTs, are tested according to the second plurality of tests on the best site $S_i$ determined at operation 510.

Then, the method can return to operation 500, and the value of i is incremented by one.

It has to be noted that the best site $S_i$ can evolve during time. For example, a first site can be considered as the best site during a first period of time, and a second site can be considered as the best site during a second period of time.

Alternatively, the method can move to operation 530 in which an indication of whether the tester 100 is faulty or operational is provided based on the results obtained at operation 520. Operation 530 is similar to operation 430.

In some embodiments, the indication of whether the tester is faulty or operational can be based on a plurality of tester quality tests performed several times at operation 520 (e.g. for different values of i).

By aggregating the different results obtained for different tester quality tests (using statistical combination, machine learning algorithms, etc.), an aggregated conclusion can be computed in order to indicate whether the tester is considered as operational or faulty.

Figure 6:
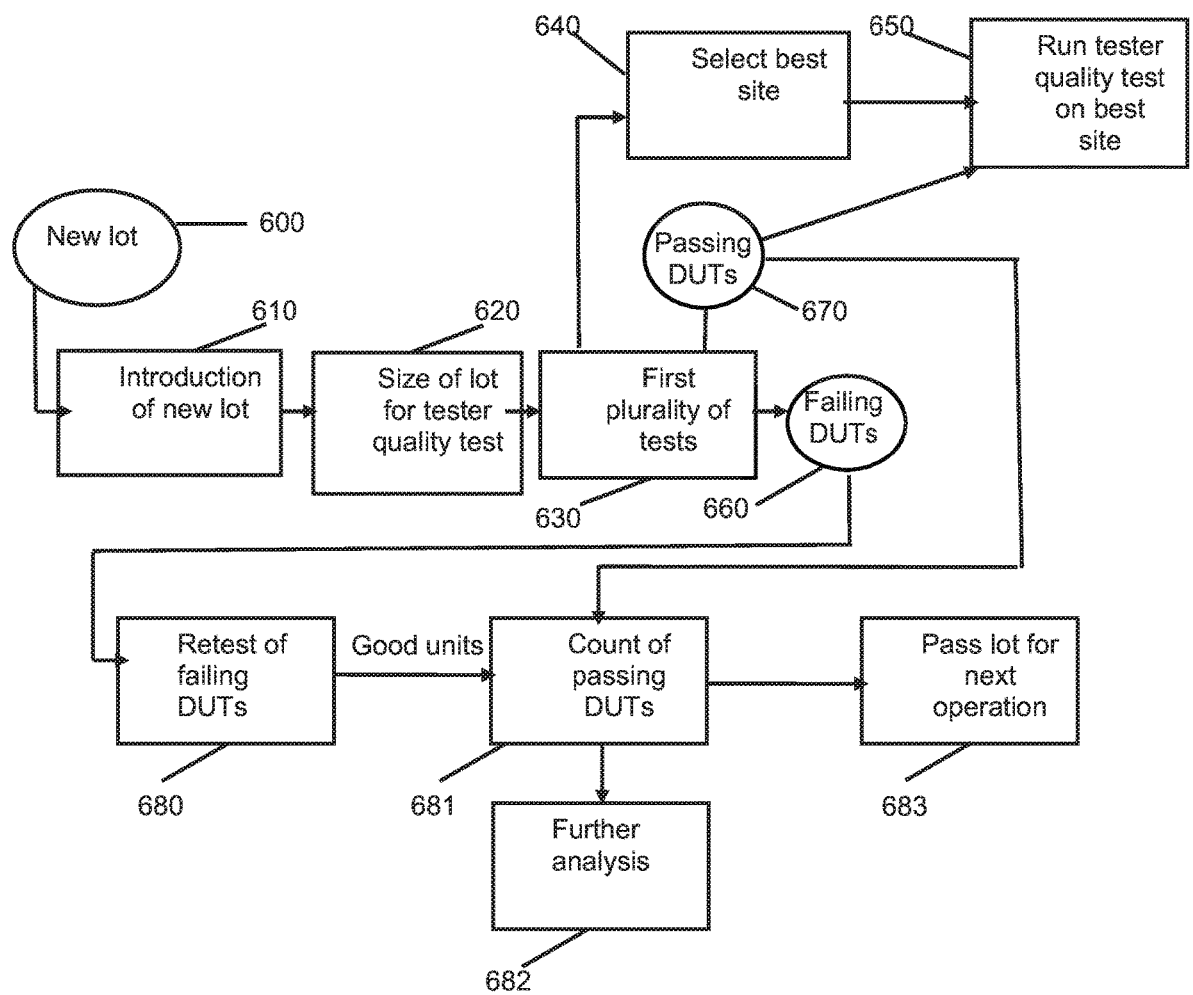
FIG. 6 illustrates operations that can be performed to test DUTs and test the tester.

Attention is now drawn to FIG. 6.

As shown, a new lot of DUTs 600 has to be tested. The lot is introduced (610) e.g. by an operator for being tested by the tester 100.

Assume the lot comprises N DUTs. According to some embodiments, a table can be stored in a memory of the tester 100, or in a memory in communication with the tester 100, which defines for different values of N, or ranges of values of N, a maximal number M (M<N) of DUTs which should be used for the tester quality test. This is illustrated in operation 620. This is however not mandatory.

At operation 630, N DUTs are tested by the tester 100 according to a first plurality of tests, using a plurality of sites of the tester 100, thereby providing first bin assignment for these DUTs. This operation is similar to that described with reference to operation 400 above.

As explained above, some of the DUTs may be considered as failing DUTs, and are therefore associated with failing first bin assignments (see DUTs 660). Some of the DUTs may be considered as passing DUTs and are therefore associated with passing first bin assignments (see DUTs 670).

Based on the first bin assignment originating from the first plurality of tests performed at operation 630, a best site (or a plurality of best sites) can be selected (operation 640). Selection of the best site is similar to operation 410 described above.

A tester quality test is then performed at the best site at operation 650 (using at least some of the passing DUTs 670), which provides second bin assignment representative of whether the tester is faulty or operational. This operation is similar to operation 420 or operation 425 described above.

As shown in FIG. 6, at least some of the failing DUTs can be retested (operation 680). This retest comprises performing again the first plurality of tests on these failing DUTs to confirm whether they are faulty.

In some embodiments, the tester quality test is run on the best site, and the retest of "failing" DUTs is performed on sites different from the best site. Therefore, simultaneous operations can be performed.

According to some embodiments, while the tester quality site 650 is run on the best site, the other sites are available for testing new DUTs (e.g. of a new lot), in order to obtain new test data of new DUTs.

In some embodiments, the failing DUTs 660 can be retested at operation 680 using a site which is different from the site at which they have been tested at operation 630.

In some embodiments, the failing DUTs, which, following repetition of the first plurality of tests, are associated this time with passing first bin assignment, can be considered as passing DUTs, since they eventually passed the first plurality of tests according to the first test criteria.

At operation 681 the number of passing DUTs can be counted and stored in a memory, e.g. of the tester 100. This count can be performed automatically by a processing unit and/or by an operator.

Following operation 681, data representative of passing and/or failing DUTs (e.g. number of passing/failing DUTs) can be compared to a quality criteria. Operation 681 can be performed e.g. by a processing unit.

Depending on the results of this comparison, the lot can be passed for next operation 683 (further manufacturing, packaging, etc.), or can be transmitted to another unit or to an engineer for further analysis 682 to detect the source of the defects.

For example, if at least one DUT is considered as a failing DUT then the lot can be transmitted for further analysis. If all DUTs that have been tested are passing DUTs (including DUTs considered as passing DUTs after retest 680), then the lot can be transmitted for the next operation. This example is however not limitative.

As shown in FIG. 6, according to some embodiments, the failing DUTs that are retested (operation 680) and finally classified as passing DUTs, are not used in the tester quality test. In other words, according to some embodiments, only DUTs that have been considered as passing DUTs following a first iteration of the first plurality of tests 630 are used in the tester quality test.

According to some embodiments, the tester quality test is automated, that is to say that at least operations 630, 640 and 650 are automated (and do not require the intervention of a human operator, although, according to some embodiments, an operator can provide commands or instructions to modify the operations).

Figure 7:
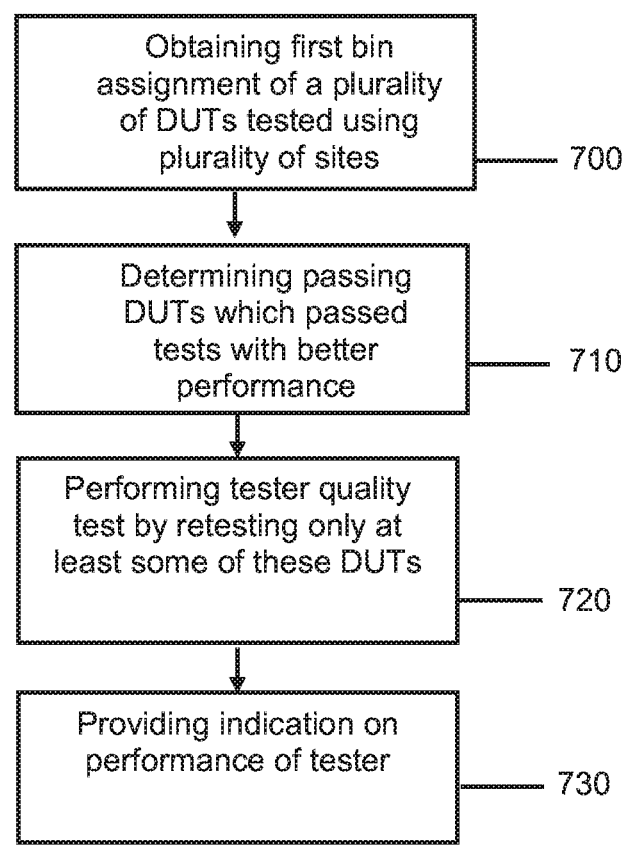
FIG. 7 illustrates another embodiment of a method of testing the tester.

Attention is now drawn to FIG. 7.

This method can be performed at least partially by e.g. a processing unit of the tester 100 and/or of the device 130.

The method of FIG. 7 can be performed in combination with the various methods described above, or independently thereof.

The method comprises operation 700 in which first bin assignment of a first plurality of DUTs (and/or test data) tested using the tester are obtained, following a first plurality of tests performed on these DUTs. The DUTs can be tested on the same site, or on different sites.

The method can further comprise operation 710 in which a second plurality of DUTs are selected as a subset $G_{best}$ of the first plurality of DUTs. DUTs of $G_{best}$ meets the following conditions:

A passing bin was assigned to DUTs belonging to following the first plurality of tests; and DUTs belonging to $G_{best}$ passed the first plurality of tests with better performance than other DUTs of the first plurality of DUTs.

This operation is similar to the determination of $G_{best}$ described with respect to operation 425 (FIG. 4B).

The method can comprise, at operation 720, instructing the tester to perform a tester quality test. This tester quality test can comprise performing a second plurality of tests on only the DUTs of $G_{best}$ (or a subset of $G_{best}$). Operation 720 differs from operation 425 above in that the tester quality test can be performed on any site of the plurality of sites, and not only on the best site.

Similarly to the first plurality of tests, test data are obtained. These test data are compared to at least one second test criteria, in order to determine whether each DUT of $G_{best}$ passed or failed the second plurality of tests.

According to some embodiments, the second test criteria is selected to be different from the first test criteria.

In particular, according to some embodiments, the second test criteria is relaxed with respect to the first test criteria. In other words, for a test which is identical in the first plurality of tests and in the second plurality of tests, it is easier to pass this test during the second plurality of tests than during the first plurality of tests.

Based on these results, a second bin assignment is obtained for each DUT of $G_{best}$. As already mentioned for operation 230, the second bin assignments are representative of performance of the tester.

Indeed, since each DUT of $G_{best}$ was considered as a passing DUT following the first plurality of tests (since a passing bin was assigned to each DUT following the first plurality of tests), if the tester is operational, the tester should assign a passing bin to the DUT following the second plurality of tests. This is true a fortiori in this embodiment in which the DUTs of $G_{best}$ are DUTs which passed the first plurality of tests with good or high performance.

Performance of the tester can be assessed similarly to that described with respect to operation 230. As mentioned above, data representative of the number of failing second bin assignments, data representative of bin switching between first bin assignment and second bin assignment, etc. can be used to assess performance of the tester.

According to some embodiments, the method can comprise providing (operation 730) an indication of the performance of the tester, based on results obtained during the tester quality test. The indication can comprise e.g. providing to an operator an output on a display (visual display, and/or audio display, etc.). According to some embodiments, this indication comprises a probability that the tester is faulty or operational.

Various embodiments of methods for testing a tester have been described. In some embodiments, a plurality of these methods can be performed, in parallel (if applicable), or sequentially.

Each method will provide, independently, indications whether the tester is faulty. Based on these indications, an aggregated indication can be provided as to whether the tester is faulty.

This aggregation can follow various rules (linear aggregation, weighted combination, non-linear aggregation, etc.).

In some embodiments, if at least one method provides that the tester is faulty, then an indication that the tester is faulty will be output.

In some embodiments, each method provides prospects (probability) that the tester is faulty and the aggregation comprises providing aggregated prospects.

It is to be noted that the various features described in the various embodiments may be combined according to all possible technical combinations.

It is to be understood that the invention is not limited in its application to the details set forth in the description contained herein or illustrated in the drawings. The invention is capable of other embodiments and of being practiced and carried out in various ways. Hence, it is to be understood that the phraseology and terminology employed herein are for the purpose of description and should not be regarded as limiting. As such, those skilled in the art will appreciate that the conception upon which this disclosure is based may readily be utilized as a basis for designing other structures, methods, and systems for carrying out the several purposes of the presently disclosed subject matter.

Those skilled in the art will readily appreciate that various modifications and changes can be applied to the embodiments of the invention as hereinbefore described without departing from its scope, defined in and by the appended claims.

The invention claimed is:

1. A method of testing a tester performance of configured to test electronic units, the method comprising:
performing, by the tester, on a first site, a first plurality of tests on each electronic unit of a first plurality of electronic units, said each electronic unit being successively connected to the tester using an interface of the first site,
performing, by the tester, on a second site, the first plurality of tests on each electronic unit of a second plurality of electronic units, said each electronic unit being successively connected to the tester using an interface of the second site, thereby obtaining a first bin assignment of each electronic unit of the first plurality of electronic units and of the second plurality of electronic units, the first bin assignment being representative of passing or failing of said each electronic unit of the first plurality of tests with respect to at least one first test criteria,
wherein data representative of the first bin assignment obtained for the electronic units of the first plurality of electronic units which have been tested on the first site meets a quality criteria,
wherein the first bin assignment representative of passing of the first plurality of tests has been obtained for a last electronic unit of the first plurality of electronic units,
sending instructions to the tester, by a processing unit and associated memory operatively coupled to the tester, to perform a tester quality test which comprises performing a second plurality of tests on the last electronic unit while it is still connected to the tester using the interface of the first site, thereby obtaining a second bin assignment for the last electronic unit, the second bin assignment being representative of passing or failing of the last electronic unit of the second plurality of tests with respect to at least one second test criteria,
wherein the second plurality of tests comprise at least a subset of the first plurality of tests, and
determining performance of the tester, based at least on the second bin assignment of the last electronic unit.

2. The method of claim 1, wherein the second test criteria is relaxed with respect to the first test criteria.

3. The method of claim 1, wherein, during the tester quality test, only the last electronic unit is tested by the tester.

4. The method of claim 1, wherein the first bin assignment of the last electronic unit corresponds to a best bin assignment among all possible bin assignments.

5. The method of claim 1, wherein data representative of at least one of a fraction and a number of first bin assignments representative of passing of electronic units of the first plurality of tests using the first site is the highest among the first site and the second site.

6. The method of claim 1, comprising determining performance of the tester based at least on a second bin assignment representative of failing of the last electronic unit of the second plurality of tests.

7. The method of claim 1, comprising determining performance of the tester based at least on bin switching between the first bin assignment and the second bin assignment of the last electronic unit.

8. The method of claim 1, wherein the first bin assignment representative of passing of the first plurality of tests has been obtained for the last electronic unit following a first iteration of the first plurality of tests by the tester on the last electronic unit.

9. A method of testing performance of a tester configured to test electronic units, the method comprising, by a processing unit and associate memory operatively coupled to the tester:
obtaining, from a storage, a first bin assignment of each electronic unit of:
a first plurality of electronic units successively connected to the tester using an interface of a first site, and
a second plurality of electronic units successively connected to the tester using an interface of a second site,
the first bin assignment of said each electronic unit being representative of passing or failing of said each electronic unit of a first plurality of tests with respect to at least one first test criteria,
wherein data representative of the first bin assignment obtained for the electronic units of the first plurality of electronic units tested on the first site meets a quality criteria,
wherein the first bin assignment representative of passing of the first plurality of tests has been obtained for given electronic units of the first plurality of electronic units,
sending instructions to the tester to perform a tester quality test which comprises performing a second plurality of tests on each of the given electronic units connected to the tester using an interface of the first site, thereby obtaining a second bin assignment for the given electronic units, the second bin assignment being representative of passing or failing of each of the given electronic units of the second plurality of tests with respect to at least one second test criteria,
wherein the second plurality of tests comprise at least a subset of the first plurality of tests, and
determining performance of the tester, based at least on the second bin assignment of the given electronic units.

10. The method of claim 9, configured to select, for the given electronic units, only electronic units of the first plurality of electronic units which passed the first plurality of tests according to the at least one first test criteria with better performance than other electronic units of the first plurality of electronic units.

11. The method of claim 9, wherein a maximal number of given electronic units depends on a total number of the first plurality of electronic units, wherein a relationship between the maximal number and the total number is predefined.

12. The method of claim 9, wherein the given electronic units comprise only electronic units for which first bin assignments representative of passing of the first plurality of tests have been obtained following a first iteration of the first plurality of tests by the tester on said electronic units.

13. A system for testing performance of a tester configured to test electronic units, the system including a processing unit and associated memory operatively coupled to the tester and configured to:
obtain, from a storage, a first bin assignment of each at electronic unit of:
a first plurality of electronic units successively connected to the tester using an interface of a first site, and
a second plurality of electronic units successively connected to the tester using an interface of a second site,
the first bin assignment of said each electronic unit being representative of passing or failing of said each electronic unit of a first plurality of tests with respect to at least one first test criteria, wherein data representative of the first bin assignment obtained for the electronic units of the first plurality of electronic units which have been tested on the first site meets a quality criteria, wherein the first bin assignment representative of passing of the first plurality of tests has been obtained for a last electronic unit of the first plurality of electronic units, send instructions to the tester to perform a tester quality test which comprises performing a second plurality of tests on the last electronic unit while it is still connected to the tester using the interface of the first site, thereby obtaining a second bin assignment for the last electronic unit, the second bin assignment being representative of passing or failing of the last electronic unit of the second plurality of tests with respect to at least one second test criteria, wherein the second plurality of tests comprise at least a subset of the first plurality of tests, and determine performance of the tester, based at least on the second bin assignment of the last electronic unit.

14. The system of claim 13, wherein the second test criteria is relaxed with respect to the first test criteria.

15. The system of claim 13, wherein, during the tester quality test, only the last electronic unit is tested by the tester.

16. The system of claim 13, wherein first bin assignment of the last electronic unit corresponds to a best bin assignment among all possible bin assignments.

17. The system of claim 13, wherein data representative of at least one of a fraction and a number of passing first bin assignments representative of passing of electronic units of the first plurality of tests using the first site is the highest among the first site and the second site.

18. The system of claim 13, configured to determine performance of the tester based at least on a second bin assignment representative of failing of the last electronic unit of the second plurality of tests.

19. The system of claim 13, configured to determine performance of the tester based at least on bin switching between the first bin assignment and the second bin assignment of the last electronic unit.

20. The system of claim 13, wherein a first bin assignment representative of passing of the first plurality of tests has been obtained for the last electronic unit following a first iteration of said first plurality of tests by the tester on the last electronic unit.

21. A system of testing performance of a tester configured to test electronic units, the system comprising, by a processing unit and associated memory operatively coupled to the tester:

obtain, from a storage, a first bin assignment of each electronic unit of:

a first plurality of electronic units successively connected to the tester using an interface of a first site, and a second plurality of electronic units successively connected to the tester using an interface of a second site, the first bin assignment of said each electronic unit being representative of passing or failing of said each electronic unit of a first plurality of tests with respect to at least one first test criteria, wherein data representative of the first bin assignment obtained for the electronic units of the first plurality of electronic units tested on the first site meets a quality criteria, wherein the first bin assignment representative of passing of the first plurality of tests has been obtained for given electronic units of the first plurality of electronic units, send instructions to the tester to perform a tester quality test which comprises performing a second plurality of tests on each of the given electronic units connected to the tester using an interface of the first site, thereby obtaining a second bin assignment for the given electronic units, the second bin assignment being representative of passing or failing of each of the given electronic units of the second plurality of tests with respect to at least one second test criteria, wherein the second plurality of tests comprise at least a subset of the first plurality of tests, and determine performance of the tester, based at least on the second bin assignment of the given electronic units.

22. The system of claim 21, configured to select, for the given electronic units, only electronic units of the first plurality of electronic units which passed the first plurality of tests according to the at least one first test criteria with better performance than other electronic units of the first plurality of electronic units.

23. The system of claim 21, wherein a maximal number of given electronic units depends on a total number of the first plurality of electronic units, wherein a relationship between the maximal number and the total number is predefined.

24. The system of claim 21, wherein the given electronic units comprise only electronic units for which first bin assignments representative of passing of the first plurality of tests have been obtained following a first iteration of the first plurality of tests by the tester on said electronic units.

25. A non-transitory storage device readable by a machine operably coupled to a tester, tangibly embodying a program of instructions executable by the machine to perform operations of testing performance of a tester configured to test electronic units, the operating including, by the machine:

obtaining, from a storage, a first bin assignment of each electronic unit of:

a first plurality of electronic units successively connected to the tester using an interface of a first site, and a second plurality of electronic units successively connected to the tester using an interface of a second site, the first bin assignment of said each electronic unit being representative of passing or failing of said each electronic unit of said first plurality of tests with respect to at least one first test criteria, wherein data representative of the first bin assignment obtained for the electronic units of the first plurality of electronic units which have been tested on the first site meets a quality criteria, wherein the first bin assignment representative of passing of the first plurality of tests has been obtained for a last electronic unit of the first plurality of electronic units, sending instructions to the tester to perform a tester quality test which comprises performing a second plurality of tests on the last electronic unit while it is still connected to the tester using the interface of the first site, thereby obtaining a second bin assignment for the last electronic unit, the second bin assignment being representative of passing or failing of the last electronic unit of the second plurality of tests with respect to at least one second test criteria, wherein the second plurality of tests comprise at least a subset of the first plurality of tests, and determining performance of the tester, based at least on the second bin assignment of the last electronic unit.

26. A non-transitory storage device readable by a machine operatively coupled to a tester configured to test electronic units, tangibly embodying a program of instructions executable by the machine to test performance of the tester, the operations comprising, by the machine:
  obtaining, from a storage, a first bin assignment of each electronic unit of:
    a first plurality of electronic units successively connected to the tester using an interface of a first site, and
    a second plurality of electronic units successively connected to the tester using an interface of a second site,
  the first bin assignment being representative of passing or failing of said electronic units of a first plurality of tests with respect to at least one first test criteria,
  wherein data representative of the first bin assignment obtained for the electronic units of the first plurality of electronic units tested on the first site meets a quality criteria,
  wherein a first bin assignment representative of passing of the first plurality of tests has been obtained for given electronic units of the first plurality of electronic units,
  sending instructions to the tester to perform a tester quality test which comprises performing a second plurality of tests on each of the given electronic units connected to the tester using an interface of the first site, thereby obtaining a second bin assignment for the given electronic units, the second bin assignment being representative of passing or failing of each of the given electronic units of said second plurality of tests with respect to at least one second test criteria,
  wherein the second plurality of tests comprise at least a subset of the first plurality of tests, and
  determining performance of the tester, based at least on the second bin assignment of the given electronic units.

* * * * *